US005718813A

United States Patent [19]
Drummond et al.

[11] Patent Number: 5,718,813
[45] Date of Patent: Feb. 17, 1998

[54] ENHANCED REACTIVE DC SPUTTERING SYSTEM

[75] Inventors: Geoffrey N. Drummond; Richard A. Scholl, both of Fort Collins, Colo.

[73] Assignee: Advanced Energy Industries, Inc., Fort Collins, Colo.

[21] Appl. No.: 42,619

[22] Filed: Apr. 2, 1993

Related U.S. Application Data

[63] Continuation-in-part of Ser. No. 998,513, Dec. 30, 1992, Pat. No. 5,427,669.

[51] Int. Cl.⁶ ............................................. C23C 14/34
[52] U.S. Cl. ........................ 204/192.12; 204/192.13; 204/192.15; 204/192.22; 204/298.03; 204/298.08
[58] Field of Search ............ 204/192.13, 192.22, 204/192.12, 192.15, 298.03, 298.08, 298.06

[56] References Cited

U.S. PATENT DOCUMENTS

| 4,103,324 | 7/1978 | Vandervelden et al. | 204/298.08 X |
|---|---|---|---|
| 4,181,541 | 1/1980 | LeFrancois | 148/16.6 |
| 4,194,930 | 3/1980 | Tanaka et al. | 148/16.6 |
| 4,396,478 | 8/1983 | Aizenshtein et al. | 204/192 R |
| 4,693,805 | 9/1987 | Quazi | 204/192.22 |
| 4,710,694 | 12/1987 | Sutphin et al. | 320/21 |
| 4,711,767 | 12/1987 | Diederich | 422/186 |
| 4,936,960 | 6/1990 | Siefkes et al. | 204/192 |

(List continued on next page.)

FOREIGN PATENT DOCUMENTS

| 528163 | 2/1993 | European Pat. Off. . | |
|---|---|---|---|
| 0 553 410 | 8/1993 | European Pat. Off. . | |
| 0 564 789 A1 | 10/1993 | European Pat. Off. | H01J 37/32 |
| 2422808 | 5/1974 | Germany . | |
| 31 21 389 | 8/1982 | Germany . | |
| 0221202 | 4/1985 | Germany | 204/298.08 |
| 0229160 | 10/1985 | Germany | 204/298.08 |
| 3919147A1 | 6/1989 | Germany . | |
| 41 13 704 | 10/1992 | Germany . | |
| 41 27 505 A1 | 2/1993 | Germany . | |
| 4127505 | 2/1993 | Germany . | |
| 0069324 | 4/1982 | Japan | 204/298.08 |
| 0030665 | 2/1986 | Japan | 204/298.08 |
| 61-30665 | 2/1986 | Japan | 204/298.08 |
| 0190168 | 8/1988 | Japan | 204/298.08 |
| 3056671 | 3/1991 | Japan | 204/298.08 |
| 3-61368 | 5/1991 | Japan | 204/298.08 |
| 1134562 | 11/1968 | United Kingdom . | |
| 2045553 | 10/1980 | United Kingdom | 204/298.08 |

OTHER PUBLICATIONS

New Method of Arc Suppression for Reactive-DC-Magnetron Sputtering; Williams, et al., pp. 1–16.
"New Method of Arc Suppression for Reactive Dc Magnetron Sputtering"; Abstract only in 1992 Technical Digest Series, vol. 23, p. 180.
PCT search report mailed Jan. 11, 1994.
A New Technique for Arc Control in DC Sputtering; L. Anderson; 1992; pp. 325–329.
The MDX as a Strategic Tool in Reducing Arcing; Doug Schatz; 1985; pp. 1–7.
Economical Considerations on Modern Web Sputtering Technology; S. Beisswenger, et al.; 1992; pp. 128–134.

*Primary Examiner*—Nam Nguyen
*Attorney, Agent, or Firm*—Luke Santangelo

[57] ABSTRACT

An enhanced reactive plasma processing method and system useful for deposition of highly insulating films. A variety of alternative embodiments are allowed for varying applications. In one embodiment, a tapped inductor is switched to ground or some common level to achieve substantial voltage reversal of about 10% upon detection of an arc condition. This reversal of voltage is maintained long enough to either afford processing advantages or to allow restoration of uniform charge density within the plasma prior to restoration of the initial driving condition. A technique for preventing arc discharges involving periodically either interrupting the supply of power or reversing voltage is effected through a timer system in the power source.

48 Claims, 2 Drawing Sheets

U.S. PATENT DOCUMENTS

| | | | |
|---|---|---|---|
| 4,963,238 | 10/1990 | Siefkes et al. | 204/192.12 |
| 4,981,566 | 1/1991 | Wurczinger | 204/298.03 X |
| 5,006,213 | 4/1991 | Sichman et al. | 204/192.14 |
| 5,009,764 | 4/1991 | Siefkes et al. | 204/298.04 |
| 5,015,493 | 5/1991 | Gruen | 204/192.31 X |
| 5,074,984 | 12/1991 | Sichman et al. | 204/192.14 |
| 5,108,571 | 4/1992 | Ludwig et al. | 204/298.03 X |
| 5,192,894 | 3/1993 | Teschner | 204/298.08 X |
| 5,212,425 | 5/1993 | Goebel et al. | 315/111.21 |
| 5,241,152 | 8/1993 | Anderson et al. | 219/121.57 |
| 5,281,321 | 1/1994 | Sturmer et al. | 204/298.08 |
| 5,303,139 | 4/1994 | Mark | 204/298.08 X |

ENHANCED REACTIVE DC SPUTTERING SYSTEM

This application is a continuation-in-part of U.S. patent application Ser. No. 07/998,513 filed Dec. 30, 1992, now U.S. Pat. No. 5,427,669 and assigned to the assignee of the present application.

I. BACKGROUND OF THE INVENTION

This invention generally relates to reactive sputtering systems in which a plasma effects some processing on a substrate. Specifically, the invention has application to DC sputtering when coating with some insulating materials formed by chemical reaction in the coating process. It also involves power supply designs used in such applications.

The field of DC plasma processing is one which is well known. In these processes, a DC power supply creates an electric potential between a cathode and anode and thereby creates a plasma. In the deposition mode, the plasma then acts upon a material target to create a thin film on some substrate. This thin film may either be comprised of the target material itself or may be the result of some reaction with some element within the coating chamber. It is the latter case, called "reactive sputtering" with which the present invention is most concerned. Naturally both the materials and elements involved and the specific applications vary greatly. Applications may range from coating architectural glass to the creation of micro chips.

One of the challenges in many such applications is that electrical discharges or arcs can occur. This is particularly true in reactive sputtering when the reactive product is an insulator, such as aluminum oxide (Al2O3). As one example, this type of coating process is particularly challenging because it involves forming insulating regions on the material target and bombarding them with ions. This leads to charging of the insulating regions which can cause electrical breakdown of the insulator. As a result, the electrical environment during reactive plasma processing can be particularly conducive to arc discharges. These arc discharges are undesirable not only because they represent potential non-uniformities in the coating process, but also because they can lead to the creation of particulates which can in turn create defects in sensitive items such as computer disks and integrated circuits. Also, it may be necessary to protect the power supply from arc discharges by turning it off momentarily, and this can adversely affect throughput. Similarly, the processing itself can be adversely affected by such insulating regions. This can have a number of results ranging from changing the characteristics of the thin film to affecting the rate or nature of the processing. In this regard the process itself is very empirical. Often these effects, and their solutions, are unpredictable and are achieved after some trial and error without a complete understanding of the exact impact on the process.

With respect to the observable problem of arc occurrences, this aspect has been well known to those skilled in the art, and has been addressed with limited success in ordinary metallic sputtering and reactive sputtering of films that are not too insulating. Initially it was common to completely shut down the process and perhaps even clean the chamber before restarting. In other instances, lower processing rates were used to make the occurrences of arcs less frequent. More recently, it has been attempted to divert the arc by quickly shutting off the supply of power to the plasma itself. Unfortunately, most such solutions acted only after damage had been done and thus served to minimize, but not completely avoid, problems in more sensitive processing environments. In order to react as quickly as possible, switch-mode or low energy storage power supplies have also been used for many applications. In spite of the fact that they inherently store less power and thus can be manipulated to minimize the negative effects of such arc occurrences, their use alone has not been sufficient for many processing environments. Interestingly, solutions by component designers have often been utilized without full explanation to those involved in the processing itself because the circuitry was considered proprietary. This may have lead to duplication of efforts and limited progress in understanding the nature of the problem; as a result the development of solutions has primarily been the result of individual effort, rather than a coordinated approach. One solution which has been publicly pursued has been the utilization of frequency-oriented components to discharge a capacitor through an inductor in such a way as to reverse the current to negate or quench the arc. Unfortunately this solution acts to increase the current in the arc initially and thus can intensify the problem before solving it. Again, this solution is undesirable especially in refined processing environments, and none of the above solutions work adequately well when the process is reactive and the reaction product is a good insulator. For this situation dc-powered reactive sputtering has generally been abandoned in favor of other, more expensive approaches (such as radio-frequency sputtering) because of the lack of a suitable arc-handling solution.

The present invention acts to virtually eliminate the occurrence of arcs in all processes but especially in extremely demanding processing environments such as the sputtering of highly insulating films by reactive sputtering of a conductive target using direct current process power. It does so by periodically clearing uneven buildup of charges and thereby eliminating the original source of the arc. It also acts to avoid processing limitations and effects to a significant extent by interrupting the supply of power or even reversing the voltage regardless of the exact cause of the problem.

II. SUMMARY OF THE INVENTION

The present invention discloses both the fundamental understandings and circuitry designs which virtually eliminate the occurrences of arcs and which afford processing advantages within a reactive DC sputtering system. In one regard, the present invention discloses a technique of periodically refurbishing the plasma and the electrical state of surfaces in the deposition system so as to avoid potential arcing conditions in the first place. In another regard, it discloses a technique of processing in a different manner which enhances processing. In addition the invention encompasses a variety of embodiments through which the supply of direct current power may be interrupted, through which the plasma current may be immediately stopped or decreased upon the actual or incipient occurrence of an arc, through which the voltage may be reversed, and through which the condition giving rise to the potential arc in the first place is negated. In its preferred embodiment, the invention involves a two stage, tapped inductor which is switched to ground. Periodically or upon the occurrence of an arc condition (an actual or incipient occurrence of an arc) the switch is activated and the circuitry acts to reverse the voltage applied to the plasma. This may either enhance processing in general or may affirmatively attract electrons from the plasma to dissipate any charge build-up which may give rise to an arcing situation. The invention also discloses techniques for sensing an arc condition or even the incipient occurrence of an arc so that immediate response is possible.

Accordingly it is an object of the invention to periodically refurbish the plasma and the electrical state of the system surfaces within a DC plasma processing system to substantially reduce the probability of an arc occurring. A goal is to achieve this automatically and perhaps even regularly. Further, a goal is not just to react to arcs which are occurring (or just about to occur), but to avoid such occurrences in the first place. Thus a goal is to present general design criteria through which systems can be manipulated to minimize or even avoid arc occurrences in the first place by periodically refurbishing the plasma and discharging system surfaces of ion buildup.

It is a further object of the invention to avoid the undesirable effects of any arcs which do occur. In so doing, the invention has a goal of efficiently reacting to arcs in a manner which minimizes any energy impact of the arc upon the coating process. As part of avoiding undesirable effects on the overall plasma processing system, the invention has a goal of acting in a manner which avoids any quenching of the plasma. This not only minimizes the effects of the arc, but it also allows restoration of the process with minimum delay. In proposing an efficient design, the present invention has as a further goal to provide a technique which may be easily adapted to existing power supply and plasma processing system designs. It also is disclosed in a fashion of an improved power supply design which is independent of the system and thus may be utilized in other similar applications.

Yet another goal is to provide methods of processing which yield performance results from the perspectives of both the resulting product and the actual processing of the product. An object is thus to achieve results regardless of the exact nature of the problems encountered. Thus a goal is to also present general design criteria through which systems can be manipulated to enhance processing in a variety of ways such as by periodically interrupting the supply of direct current power and by periodically reversing the voltage applied.

As mentioned, a general goal of the present invention is to present a process which can be implemented in a variety of ways. A tapped inductor design is disclosed as only one embodiment. This design has been selected in order to minimize circuitry elements and to cause a variety of refinements in the techniques and even to combine techniques. Certainly other designs are possible as those skilled in the art would readily understand once they understand the general principles involved. In disclosing embodiments which may be implemented in a variety of ways, it is a goal to encompass a variety of enhanced techniques. In many such designs a goal could include the earliest detection of a potential arc occurrence so as to allow a prompt reaction. In some embodiments, a goal is to periodically cause effects in a variety of manners.

Naturally further objects of the invention are disclosed throughout other areas of the specification and claims.

III. BRIEF DESCRIPTION OF THE DRAWINGS

IV. DETAILED DESCRIPTION OF THE PREFERRED EMBODIMENTS

As will be readily understood, the basic concepts of the present invention may be embodied in a variety of ways.

Figure 1:
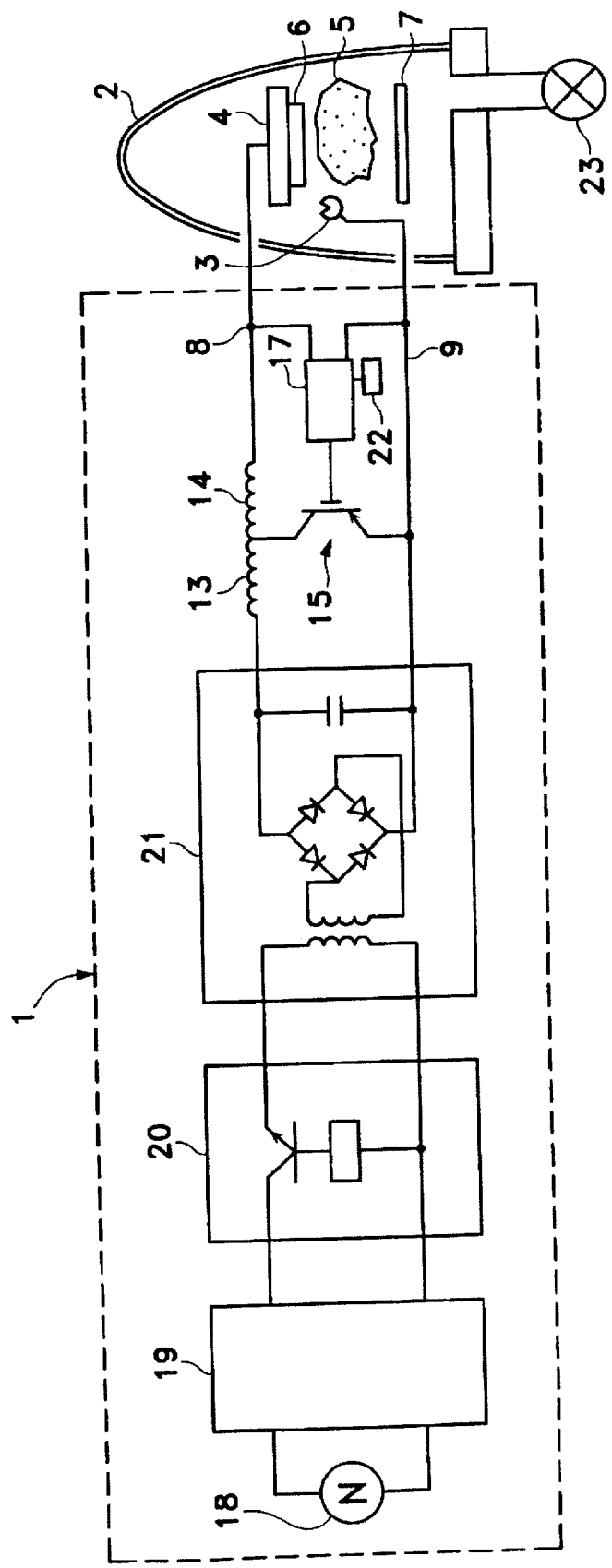
FIG. 1 is a circuit schematic of a processing system including one embodiment of the present invention.

Referring to FIG. 1, the tapped inductor embodiment can be readily understood. In general, the reactive DC sputtering system includes the elements shown in FIG. 1. Specifically, DC power source (1) is connected to coating chamber (2) within which cathode (4) and anode (3) are contained. In the deposition mode, the DC power source (1) causes deposition of a coating material by creating an electric potential across material target (6) (or cathode (4)) and anode (3) to result in plasma (5). Plasma (5) then acts upon material target (6) so as to result in a coating on substrate (7). The material target (6) may be positioned or disposed so as to expose coating material which is consumed in the processing. As shown, such coating material may be the actual material of which the material target (6) itself is made through merely exposing one surface of material target (6). This coating may to some extent be an electrically insulating material such as the original target material combined with some other elements such as one or more reactive gas(es) as may be contained within reactive gas supply (23). Further cathode (4) may actually be material target (6) as could be readily understood. Regardless, DC power source (1) acts to provide a direct current power output through first and second leads (8 & 9) into the plasma load to cause deposition by action of the plasma.

In creating some electrically insulating material, it should be understood that it is not necessary to only create and deposit insulating material. It is possible that a number of species could be created and that only some of these may be an electrically insulating material. The problems of charge buildup and process degradation can still exist. It is also possible that the electrically insulating material which causes the problems is not that deposited on substrate (7). Again, the techniques of the present invention can cause improvements regardless of the nature of the problems or the deposition.

With respect to the problem of arc occurrences, it can be understood that given enough voltage, and sufficient variance in processing environments within coating chamber (2), arc discharges can occur from plasma (5) or cathode (4) to anode (3) and material target (6). It can be understood that such discharges may occur for a variety of reasons. In the specific case of reactive sputtering, where the reaction product is a good insulator, arc discharges can be caused by the injection of electrons into the plasma from a spot on the target. The electrons may come from the destructive breakdown of the insulating film on the target formed by the reactive gas or gases used in the process. The breakdown appears to occur because of the charging of the material target surface. Since the plasma is composed of positively and negatively charged particles, this may be due to the arrival of ions attracted from the plasma by the direct current potential created there by the power source.

When excess electrons are injected into the plasma, an area prone to strong electrical conduction may occur. Of potential importance to the understanding of the present invention for many applications is the fact that the increase in the plasma density in the region of the arc may, through the mechanism of impact ionization of neutral gas atoms due to the continued instreaming of electrons from the target, quickly increase with time to become the low impedance path known as an arc. Even if the power source detects this condition relatively quickly, damage can be done to the thin reactive film growing on the target surface; this damage can result in particulates being created, which in turn can reduce product yield in the final process. If the power source does not detect the arc condition quickly, even more damage can be done to the target surface, including formation and ejection of molten material from the base target metal. It is a twin goal of this invention to prevent the formation of arcs by preventing charge buildup on the system surfaces and also to act very quickly if the conditions of arc formation are present to prevent the plasma density from being built up to potentially destructive levels. The first of these twin goals can be accomplished in at least one manner if the voltage on the target is periodically reversed for a short time. The voltage reversal may attract electrons from the plasma to discharge uneven buildup of ions or other charged particles on the target surface or elsewhere, and, if done for only a short time, the positive ions which may be repelled by the positive voltage may not have time to move far before the original negative voltage is reestablished. The second of the twin goals is accomplished in the same manner; if at the instant of detection of an arc formation condition the voltage on the target is reversed, electrons will be removed from the plasma arc location, which prevents the arc from building up. Therefore both goals are accomplished by the expedient of voltage reversal, in the one case upon detection of an arc formation condition, and in the other upon command of a periodic clock. Each such technique acts to clear an uneven buildup of charged particles even though it may not clear all uneven buildups.

As mentioned, the supply of power or of voltage may merely be interrupted. This may include effectively disconnecting or just stopping the supply of power. The voltage may also be reversed. It should be noted that any voltage reversal, and even any interruption, should not be present for too long a period as the result would be to drive the positive ions to the walls of the system chamber where they would be lost. The result would be that the plasma would need to be reignited when the original negative voltage were reestablished. Thus the actions taken may be limited to exist for time periods such as from approximately 1 microsecond to approximately 10 microseconds as plasmas often do not extinguish in such timeframes. Naturally, in instances where a plasma did not extinguish for either a shorter or a longer period, the time during which the action occurs may be adjusted accordingly. For instance, in systems in which the plasma tends not to extinguish for about 100 microseconds, the time of interruption or reversal could be lengthened to a time period somewhat short of this duration.

In addition it is important to note that in instances where the voltage is reversed to some degree, it need not be reversed to a large positive voltage. Since electrons (which it is a goal to attract to the target) are very small and mobile, they can be attracted with very little voltage. The larger, sluggish, ions will not move far if the reversed voltage is not too large and the reversal time is not too long. Thus in practice reverse voltages of from about +10 volts to +100 V (since the operating voltage is usually negative) or alternatively about 5% to 20% of the normal operating voltage appear to be appropriate. Naturally, other amounts are possible within the scope of reversing to some degree. In addition, the reversal may be substantial, that is an amount which can cause the effects desired or which can move the charged particles as necessary. This reversal of voltage is with respect to the chamber itself which is often maintained at ground.

As mentioned, the interruption, reversal, or other condition should not last so long as to quench the plasma. This avoids any need to reignite the plasma. Specifically, times ranging from approximately 1 microsecond to approximately 10 microseconds appear practical. Naturally, this may vary depending upon the geometries employed, the amount of reverse voltage involved, and the nature of the plasma itself. In some applications, what constitutes a substantial voltage reversal may even be reduced in instances where the duration of the reversal is longer. Again, the goals of either enhancing processing regardless of the cause, clearing uneven buildups, or merely interrupting the processing need only be met. As preferred, the combination of the reverse voltage range of about 10 to 100 volts or 5% to 20% of the operating voltage for a time of about from 1 to 10 microseconds seems to function well in a variety of applications. This potential interrelation may thus make the specific combination of the time the switch is engaged, the time of uninterrupted processing, and the percentage of voltage reversal unique in its own regard.

To provide as little an interruption in the processing as possible, the duration of the interruption, reversal, or other condition, may be (but need not be) kept short compared to the uninterrupted, continuous processing time. This also could vary depending upon the processing involved. Keeping the time short allows processing to occur for as long as possible and enhances throughput. By avoiding interruptions which are not short (such as a 50% interruption) the techniques achieve another goal, namely, maximizing the commercial value of the system. Naturally, variation in these times are possible. Similarly, the uninterrupted, continuous processing time may be kept as long as possible. Thus the normal operating level of power or voltage may be roughly maintained (the plasma is often a very electrically varying environment) until it is necessary to refurbish the process. Since this may be determined by the amount of time it takes to buildup uneven concentrations of charged particles, this time can vary. In most systems, it is believed that the continuous deposition time during which uninterrupted, continuous processing may occur should be from approximately 10 microseconds to approximately 2000 microseconds. Thus the periodic condition—be it reversal, interruption, or some other condition—should occur from every 10 to 2000 microseconds in many applications.

Figure 2:
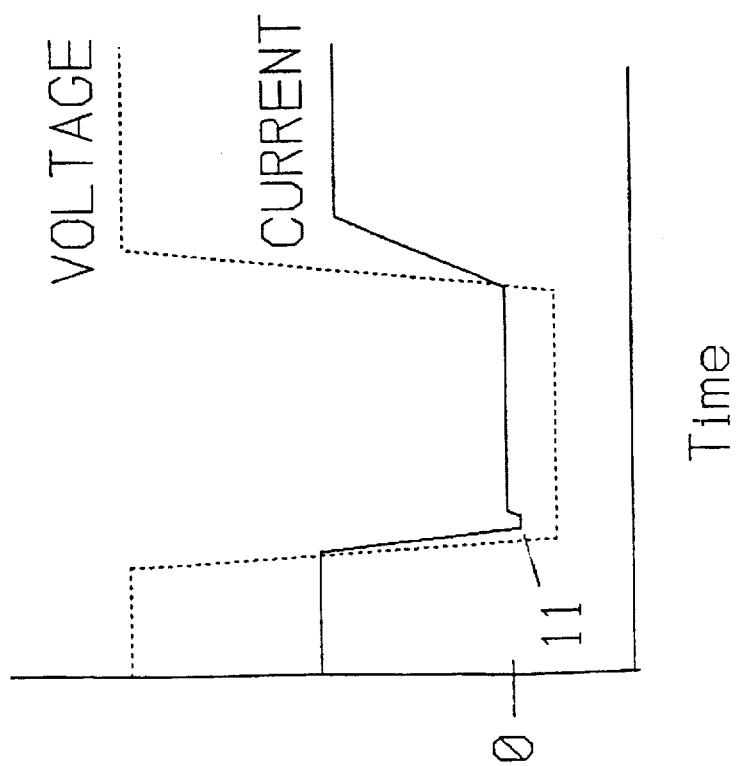
FIG. 2 is a plot showing the relative changes in current and voltage as created by one embodiment of the invention in reacting to a timed, self trigger event.

Referring to FIG. 2 it can be seen how in one embodiment the invention may react to a periodic, timed or self triggered event. When timer circuitry (22) causes switch (15) to engage, the voltage falls very rapidly to a reversed condition. As shown in FIG. 2, similarly, the current falls quickly. Apparent in FIG. 2 is an impulse of negative current (11) which may occur as the voltage reverses. This may be caused by the electron current flowing to discharge the target surface and thus help eliminate the uneven buildup of charge.

Figure 3:
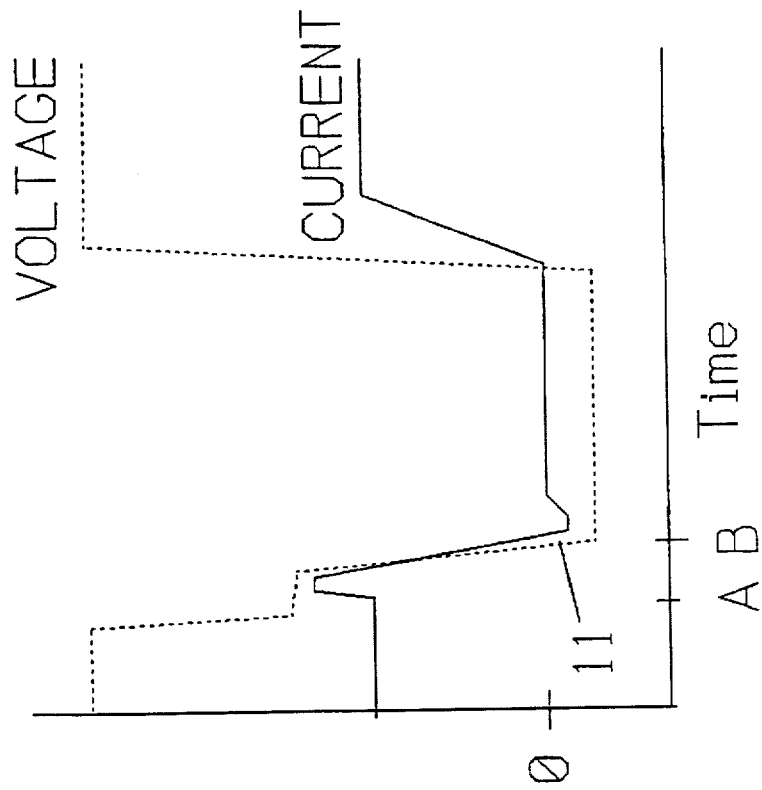
FIG. 3 is a plot showing the relative changes in current and voltage as created by one embodiment of the invention in reacting to a potential arc event.

FIG. 3, shows how the same embodiment may react to a potential arc occurrence. Upon the incipient occurrence of an arc at time A, the level of voltage falls (or the rate of change in the voltage may vary). As will be discussed later with respect to how an incipient arc is sensed, this may be one aspect which gives rises to activation which in this embodiment causes a reversal of voltage as shown at time B. Again, an impulse of negative current (11) may occur due to electron current flowing to discharge the target surface or the like to eliminate the uneven buildup of charge. In this situation, however, some increase in current is likely to occur as the arc begins to appear but before it is stopped by action of switch (15). In either situation, the reversal may act as one way to eliminate the uneven buildup of charge within the plasma processing system. This uneven buildup may occur within plasma (5) or may occur on material target (6) or even on some other mask or other element within the processing system. The propensity to arc may also be the result of other anomalies. By reversing voltage, the current is not only immediately stopped, but the conditions giving rise to such a current may be negated. The plasma is thus restored to its net uniform distribution. As shown in both FIGS. 2 and 3, typical recovery can occur as is known in the art. This may include ramping or reinstating the voltage as shown until current is restored and a steady state condition is resumed.

As mentioned the uneven build-up of charge may occur within plasma (5) or may occur on material target (6) or even on some other mask or other element within the processing system. The propensity to arc may also be the result of other anomalies. By reversing, interrupting, or otherwise acting—whether upon sensing of an arc event or strictly after the passage of time—any such current is not only immediately stopped, but the conditions giving rise to such a current may be negated. The plasma is thus restored to its net uniform distribution. As mentioned, either this uniform distribution or perhaps merely some processing advantages might be achieved in some systems in a variety of ways including merely interrupting the supply of power or voltage to the chamber. Since the processes are not fully understood, it should be understood that regardless of the reasons involved, advantages can be obtained by utilizing the techniques disclosed.

As can be readily understood by those skilled in the art, even though the supply of power is effectively switched off in prior art designs, current may not be immediately stopped or decreased. This may be the result of the storage of energy within the power supply circuitry. In order to achieve immediate stoppage of current in some systems, any discharge of energy which effects the process must be avoided or minimized. In reactive applications such as that for optical coatings, this may need to occur within fractions of a microsecond.

Referring again to FIG. 1, one embodiment for achieving these ends by reversing voltage is disclosed. As can be seen, this embodiment includes an inductor having first and second inductor portions (13 and 14) connected in series along first lead (8). As may be readily understood, first and second inductor portions (13 and 14) may be arranged in a variety of fashions and may even be designed in a transformer configuration. Importantly, these first and second inductor portions (13 and 14) are magnetically coupled. A switch (15) is also connected in between first and second inductor portions (13 and 14) to second lead (9). This switch may be controlled by a means for activation circuitry or, as shown directly by some sensor (17). In such an arrangement, sensor (17) may be triggered to act in a variety of ways to detect an arc condition as the actual presence or incipient presence of an arc occurrence within plasma (5). As can be understood from FIG. 1, upon triggering of switch (15), the voltage applied across plasma (5) is immediately reversed as a result of the inductor being connected in series along first lead (8). This reversal may cause the immediate stoppage of current through plasma (5), may also act to clear the plasma of any uneven build-up of charge as discussed earlier, or may simply afford process advantages for unknown reasons. Voltage may naturally be reversed through a variety of other manners and still be considered an equivalent of the present invention including but not limited to supplying another power source output or switching to reverse voltage, and the like.

In order to reverse the voltage as discussed with reference to FIGS. 2 and 3, second inductor portion (14) may not only be magnetically coupled to first inductor portion (13), but it may also have a turns ratio of at least about 10% of that of first inductor portion (13). In such a fashion, the turns ratio would dictate the magnitude of the reverse voltage. Since a substantial reverse voltage is desired (and in some instances either about 5% to 20% of the normal operating level or even 10 V to 100 V), a turns ratio of at least about 10% would achieve the goals mentioned earlier. Naturally other inductor geometries and even other components could be used in an equivalent fashion and would still fall within the scope of this patent. Not only may the reverse voltage be at least enough to quickly clear the undesirable condition, it may also not be so large as to risk reigniting an arc or to risk driving the plasma in a reverse mode and thereby quenching it. Naturally, these limiting values will vary depending upon application, but for the applications presently contemplated, it is believed the limits discussed are adequate. Note that it is possible that some existing designs in other applications when acting to shut off a power source might achieve a slight voltage reversal. Even if applied to reactive sputtering, this slight voltage reversal is merely an incident of particular circuit designs and would not be the substantial voltage reversal involved for some aspects of the present invention as they achieve elimination of the uneven charge build-ups. In addition, the design of switch (15) would be preferably of the non-latching type so as to allow easy opening of switch (15) to stop the reversal or other condition. With respect to particular designs of switch (15) it has been found that integrated gate bipolar transistors, field effect transistors, darlington bipolar transistors and regular bipolar transistors are adequate, however, the integrated gate bipolar transistors affords easier control in the present configuration.

Referring to FIG. 3, it can be seen that for aspects which react to potential arc occurrences, the earliest sensing of a potential arc occurrence is desirable. In this manner the magnitude of the increase of current due to an arc is thereby reduced. In the embodiment shown in FIG. 1, it is shown that sensor (17) acts to sense conditions as close to plasma (5) as possible. In so doing, more accurate readings naturally occur. Through proper configuration as those skilled in the art would readily understand, a variety of sensing decisions can be utilized. As shown in FIG. 3, the voltage falls abruptly in response to an arc event, and therefore some combination of either or both a high rate of change in the output voltage or current and/or a low output voltage or increasing current may be utilized and detected. In the preferred embodiment, it has been found that using an absolute voltage value reliably indicates incipient arc occurrences at the earliest possible time. With respect to the voltage value, either some specific voltage drop in the output voltage such as 200 volts or some percentage voltage drop such as 40% may be utilized. Naturally the percentage determination may vary by application, but it is believed that a low voltage of about 40% to 50% of the nominal output of the supply provides adequate performance in many applications while allowing for inherent variation in the normal operating levels. In addition, other designs are certainly possible including circuits which "cock" when the output voltage or current rises above some level and then "fire" when it subsequently drops back below that level. Again, while this novel detection technique is conceptually founded, the actual values might be experimentally determined for the particular systems involved.

Referring again to FIG. 1, it can be understood how a particular power source might be modified to accomplish the goals of the present invention. As those skilled in the art would readily understand when a switch mode power supply were involved, the DC power source (1) may include an oscillator (18). Oscillator (18) might be merely some alternating power input or some means for accepting alternating power. The alternating power is at a predominant frequency and would then be converted through converter (19) into direct current power. A power supply switch (20) would then be included as known to create an alternating signal at a higher frequency. This alternating signal would then be retransformed to a DC output through rectifier (21). With respect to FIG. 1, while some conceptual elements are shown within power supply switch (20) and rectifier (21) these are for visual understanding only. They do not limit the scope of the devices deemed to fall within the scope of this patent since such aspects and their equivalents are well known in the art. To modify the power source, the inductor including first and second portions (13 and 14), switch (15), and a control means such as the sensor (17) and timer circuitry (22) shown and discussed earlier would be included within DC power source (1). Thus DC power source would not only supply a voltage, it would include a means for analyzing the output or a voltage and a means for immediately stopping current from flowing through its load. Through inclusion of second inductor portion (14) and switch (15), this modified power source would include voltage reversal circuitry that can reverse the voltage to the load. Other such means are also possible including other configurations of merely some switch or even other power supply elements. Naturally, if no second inductor portion were included, switch (15) and timer circuitry (22), again regardless as to where configured or how achieved, might serve as interruption circuitry that interrupts the direct current power. In such an embodiment no reverse voltage might occur, however, given proper system design, immediate stoppage of current through plasma (5) might occur or merely interrupting the supply of power or voltage might occur. In such a design, the inclusion of first inductor portion (13) may still serve a valuable purpose. When switch (15) is activated, having a large first inductor portion (13) would serve to provide sufficient load to DC power source (1) so that this immediate change in load would not cause undue stress to power source (1). In reference to the size of first inductor portion (13), such would be considered "large" within the context of this invention so long as the inductance of first inductor portion (13), when combined with the impedance of switch (15), and the power supply output impedance would result in a time constant sufficiently larger than the amount of time the switch would be engaged. As those skilled in the art would readily understand, this type of configuration would cause power supply to remain sufficiently loaded and unstressed throughout the time switch (15) were engaged.

When utilized in a DC plasma processing system, the power source itself would furnish direct current power to cause deposition of a coating material and would have a design that might connect first and second leads to achieve its end. In any arrangement, timer circuitry (22) might also serve to engage switch (15) for the prescribed times; it might also serve to allow uninterrupted, continuous processing for the prescribed times by only causing switch (15) to activate so often.

In addition, such a power source and system could be operated in a preventive mode through which plasma (5) could be periodically cleared of any uneven buildup of charged particles by applying a substantial reverse voltage. This periodic clearing might occur as frequently as approximately every 10 microseconds to approximately every 2000 microseconds, again, depending upon the particular process involved as discussed earlier. By providing some timer circuitry (22) to activate switch (15), again regardless of where configured or how achieved, clearing circuitry could be achieved as those skilled in the art would readily understand. Naturally, other means for clearing the plasma could also be accomplished ranging from merely interrupting the supply of power, stopping the voltage, or even introducing other physical phenomena.

With reference to the claims, it can be seen that in many instances, one element is responsive to another element. This is meant in its broadest sense. For instance, since sensor (17) detects conditions which ultimately cause some operation of switch (15), switch (15) should be deemed responsive to sensor (17). This is in spite of the fact that the output may be filtered, transformed, or evaluated by another element such as a programmable processor and the like. In the broad sense intended, all that is necessary for this example is that switch (15) vary its operation based upon sensor (17) in order to be deemed "responsive" to sensor (17). Intermediate processing or manipulation would not impact this responsiveness. Similarly as those skilled in the art would understand, many steps in the techniques discussed can be accomplished at varying points in time, in varying orders, and even at external locations. Naturally each such variation would fall within the scope of this patent. This is particularly true for the present invention since inputs can be provided or created at differing points and since processing capability can be achieved or distributed throughout the design or applied externally. Hardwired designs, firmware designs, and pure programming or subroutines should also be understood to fall within the scope of this invention.

The foregoing discussion and the claims which follow describe the preferred embodiments of the present invention. Particularly with respect to the claims, it should be understood that changes may be made without departing from their essence. In this regard, modifications and changes falling within the scope of this patent are not to be limited by the particular apparatus or steps selected as the preferred embodiment. Rather, such modifications and changes as would be known to those skilled in the art to achieve the same function should be deemed to fall within the scope of the claims of this patent. This is particularly true in reference to those elements described as a means for a particular function or functionally since, as those skilled in the art would readily understand, software and hardware embodiments are possible. Naturally, to the extent such revisions utilize the essence of the present invention they fall within the breadth of protection encompassed by this patent.

We claim:

1. A method of reactive sputtering comprising the steps of:
   a. supplying a material target to expose coating material within a coating chamber;
   b. supplying at least one reactive gas within said coating chamber wherein said gas reacts with said coating material to form electrically insulating material;
   c. furnishing direct current power to said coating chamber to create a plasma composed of charged particles;
   d. causing deposition of at least some of said electrically insulating material upon a substrate through action of said plasma;
   e. clearing an uneven buildup of charged particles within said chamber so as to avoid potential arcing conditions in the first place wherein said step of clearing an uneven buildup of charged particles occurs for a time which does not extinguish said plasma; and then
   f. continuing to cause deposition upon said substrate.

2. A method of reactive sputtering as described in claim 1 wherein said step of clearing an uneven buildup of charged particles is accomplished from approximately every 10 microseconds to approximately every 2000 microseconds.

3. A method of reactive sputtering comprising the steps of:
   a. supplying a material target to expose coating material within a coating chamber;
   b. supplying at least one reactive gas within said coating chamber wherein said gas reacts with said coating material to form electrically insulating material;
   c. furnishing direct current power by applying a voltage within said coating chamber to create a plasma composed of charged particles;
   d. causing deposition of at least some of said electrically insulating material upon a substrate through action of said plasma; and
   e. reversing said voltage so as to avoid potential arcing conditions in the first place during said deposition wherein said step of reversing said direct current power occurs for a time which does not extinguish said plasma; and then
   f. continuing to cause deposition upon said substrate.

4. A method of reactive sputtering as described in claim 3 wherein said voltage which is applied within said chamber has a normal operating level and wherein said step of reversing said voltage comprises the step of applying a reverse voltage at a level of between 5 and 20 percent of the normal operating level.

5. A method of reactive sputtering as described in claim 3 wherein said coating chamber is maintained at a voltage level and wherein said step of reversing said voltage comprises the step of applying a reverse voltage of between 10 and 100 volts with respect to the voltage level of said coating chamber.

6. A method of reactive sputtering as described in claim 3 or 5 wherein said step of reversing said voltage occurs for a time which does not extinguish said plasma.

7. A method of reactive sputtering as described in claim 3 wherein said step of reversing said voltage is accomplished from approximately every 10 microseconds to approximately every 2000 microseconds.

8. A method of reactive sputtering as described in claim 3 wherein said step of reversing said voltage occurs for a time of from approximately 1 microsecond to approximately 10 microseconds.

9. A method of reactive sputtering as described in claim 8 wherein said step of reversing said voltage is accomplished from approximately every 10 microseconds to approximately every 2000 microseconds.

10. A method of reactive sputtering comprising the steps of:
    a. supplying a material target to expose coating material within a coating chamber;
    b. supplying at least one reactive gas within said coating chamber wherein said gas reacts with said coating material to form electrically insulating material;
    c. furnishing direct current power by applying a voltage within said coating chamber to create a plasma composed of charged particles;
    d. causing deposition of at least some of said electrically insulating material upon a substrate through action of said plasma; and
    e. interrupting said direct current power so as to avoid potential arcing conditions in the first place wherein said step of interrupting said direct current power occurs for a time which does not extinguish said plasma; and then
    f. continuing to cause deposition upon said substrate.

11. A method of reactive sputtering as described in claim 10 wherein said step of interrupting said direct current power is accomplished from approximately every 10 microseconds to approximately every 2000 microseconds.

12. A method of reactive sputtering as described in claim 10 wherein said step of interrupting said direct current power occurs for a time of from approximately 1 microsecond to approximately 10 microseconds.

13. A method of reactive sputtering as described in claim 12 wherein said step of interrupting said direct current power is accomplished from approximately every 10 microseconds to approximately every 2000 microseconds.

14. A reactive plasma sputtering system comprising:
    a. a coating chamber;
    b. a material target disposed to expose coating material within said chamber;
    c. a reactive gas supply connected to said coating chamber wherein said gas reacts with said coating material to form electrically insulating material;
    d. an anode positioned within said coating chamber in proximity to said material target;
    e. a DC power source having a first lead connected to said material target and a second lead connected to said anode;
    f. an inductor means connected in series along said first lead and having first and second inductor portions wherein said first and second portions are magnetically coupled; and
    g. a switch connected from said second lead to said first lead at a point in between said first and second inductor portions.

15. A reactive plasma sputtering system as described in claim 14 wherein said first inductor portion is large.

16. A reactive plasma sputtering system as described in claim 15 wherein said first inductor portion and said second inductor portion define a turns ratio with respect to each other and wherein the turns ratio of said second inductor portion to said first inductor portion is at least about 10%.

17. A reactive plasma sputtering system as described in claim 14 wherein said first inductor portion and said second inductor portion define a turns ratio with respect to each other and wherein the turns ratio of said second inductor portion to said first inductor portion is at least about 10%.

18. A reactive plasma sputtering system as described in claim 14, 17, or 16 and further comprising a sensor wherein said switch is responsive to said sensor.

19. A reactive plasma sputtering system as described in claim 18 wherein said DC power source has an output voltage and wherein said sensor detects said output voltage.

20. A reactive plasma sputtering system as described in claim 18 wherein said DC power source causes an output voltage and wherein said sensor detects a rate of change in said output voltage.

21. A reactive plasma sputtering system as described in claim 20 wherein said sensor also detects said output voltage.

22. A reactive plasma sputtering system as described in claim 14 and further comprising timer circuitry wherein said switch is responsive to said timer circuitry.

23. A reactive plasma sputtering system as described in claim 22 wherein said timer circuitry causes said switch to activate from approximately every 10 microseconds to approximately every 2000 microseconds.

24. A reactive plasma sputtering system as described in claim 22 wherein said timer circuitry engages said switch for approximately 1 microsecond to approximately 10 microseconds.

25. A reactive plasma sputtering system as described in claim 24 wherein said timer circuitry causes said switch to activate from approximately every 10 microseconds to approximately every 2000 microseconds.

26. A reactive plasma sputtering system comprising:
  a. a coating chamber;
  b. a material target disposed to expose coating material within said chamber;
  c. a reactive gas supply connected to said coating chamber wherein said gas reacts with said coating material to form electrically insulating material;
  d. an anode positioned within said coating chamber in proximity to said material target;
  e. a DC power source which applies an output voltage across said anode and said material target; and
  f. voltage reversal circuitry which acts so as to avoid potential arcing conditions in the first place during processing and then to automatically resume said processing wherein said voltage reversal circuitry causes a voltage reversal for a time which does not extinguish said plasma.

27. A reactive plasma sputtering system as described in claim 26 wherein said voltage reversal circuitry creates a reverse voltage level and wherein said reverse voltage level is at least five percent of said output voltage.

28. A reactive plasma sputtering system as described in claim 26 wherein said DC power source continuously applies a voltage across said anode and said material target for a continuous deposition time period.

29. A reactive plasma sputtering system as described in claim 26 and further comprising a sensor wherein said voltage reversal circuitry is responsive to said sensor.

30. A reactive plasma sputtering system as described in claim 29 wherein said sensor detects said output voltage from said DC power source.

31. A reactive plasma sputtering system as described in claim 29 wherein said sensor detects a rate of change in the output voltage from said DC power source.

32. A reactive plasma sputtering system as described in claim 31 wherein said sensor also detects said output voltage from said DC power source.

33. A reactive plasma sputtering system as described in claim 26 wherein said DC power source has a first lead connected to said material target and a second lead connected to said anode and wherein said voltage reversal circuitry comprises:
  a. an inductor connected in series along said first lead and having first and second inductor portions wherein said first and second portions are magnetically coupled; and
  b. a switch connected from said second lead to said first lead at a point in between said first and second inductor portions.

34. A reactive plasma sputtering system as described in claim 33 wherein said voltage reversal circuitry further comprises a sensor and wherein said switch is responsive to said sensor.

35. A reactive plasma sputtering system as described in claim 34 wherein said sensor detects said output voltage from said DC power source.

36. A reactive plasma sputtering system as described in claim 34 wherein said sensor detects a rate of change in the output voltage from said DC power source.

37. A reactive plasma sputtering system as described in claim 36 wherein said sensor also detects said output voltage from said DC power source.

38. A reactive plasma sputtering system as described in claim 26 and further comprising timer circuitry wherein said voltage reversal circuitry is responsive to said timer circuitry.

39. A reactive plasma sputtering system as described in claim 38 wherein said timer circuitry causes said voltage reversal circuitry to activate from approximately every 10 microseconds to approximately every 2000 microseconds.

40. A reactive plasma sputtering system as described in claim 38 wherein said timer circuitry causes said voltage reversal circuitry to activate for approximately 1 microsecond to approximately 10 microseconds.

41. A reactive plasma sputtering system as described in claim 40 wherein said timer circuitry causes said voltage reversal circuitry to activate from approximately every 10 microseconds to approximately every 2000 microseconds.

42. A reactive plasma sputtering system as described in claim 26 wherein said output voltage creates a plasma current, wherein said voltage reversal circuitry creates a reverse voltage level for a reverse voltage time, and wherein said reverse voltage level for said reverse voltage time allow said plasma current to reach zero.

43. A reactive plasma sputtering system comprising:
  a. a coating chamber;
  b. a material target disposed to expose coating material within said chamber;
  c. a reactive gas supply connected to said coating chamber wherein said gas reacts with said coating material to form electrically insulating material;
  d. a DC power source wherein which applies direct current power within said coating chamber to cause processing; and
  e. clearing circuitry which acts to clear an uneven buildup of charged particles so as to avoid potential arcing conditions in the first place during processing, which acts for a time which does not extinguish said plasma, and which then acts to automatically resume said processing.

44. A reactive plasma sputtering system as described in claim 43 wherein said clearing circuitry causes periodic clearing from approximately every 10 microseconds to approximately every 2000 microseconds.

45. A reactive plasma sputtering system comprising:
  a. a coating chamber;
  b. a material target disposed to expose coating material within said chamber;
  c. a reactive gas supply connected to said coating chamber wherein said gas reacts with said coating material to form electrically insulating material;
  d. a DC power source which applies direct current power within said coating chamber to cause processing; and
  e. interruption circuitry which interrupts said direct current power so as to avoid potential arcing conditions in the first place during processing, which acts for a time which does not extinguish said plasma, and then which automatically resumes said processing.

46. A reactive plasma sputtering system as described in claim 45 wherein said interruption circuitry causes interruption from approximately every 10 microseconds to approximately every 2000 microseconds.

47. A reactive plasma sputtering system as described in claim 45 wherein said interruption circuitry causes interruption for approximately 1 microsecond to approximately 10 microseconds.

48. A reactive plasma sputtering system as described in claim 47 wherein said interruption circuitry activates from approximately every 10 microseconds to approximately every 2000 microseconds.

* * * * *